United States Patent [19]

Broadbent

[11] Patent Number: 5,063,175

[45] Date of Patent: Nov. 5, 1991

[54] METHOD FOR MANUFACTURING A PLANAR ELECTRICAL INTERCONNECTION UTILIZING ISOTROPIC DEPOSITION OF CONDUCTIVE MATERIAL

[75] Inventor: Eliot K. Broadbent, San Jose, Calif.

[73] Assignee: North American Philips Corp., Signetics Division, Sunnyvale, Calif.

[21] Appl. No.: 287,582

[22] Filed: Dec. 16, 1988

Related U.S. Application Data

[63] Continuation of Ser. No. 224,275, Jul. 25, 1988, abandoned, which is a continuation of Ser. No. 913,428, Sep. 30, 1986, abandoned.

[51] Int. Cl.$^5$ ..................... H01L 21/44; H01L 21/48
[52] U.S. Cl. .................................. 437/192; 437/190; 437/195; 357/71
[58] Field of Search .......................................... 437/192

[56] References Cited

U.S. PATENT DOCUMENTS

| | | | |
|---|---|---|---|
| 4,107,726 | 8/1978 | Schilling | 397/71 |
| 4,367,119 | 1/1983 | Logan et al. | 29/580 |
| 4,400,865 | 8/1983 | Goth et al. | 29/590 |
| 4,410,622 | 10/1983 | Dalal et al. | 156/659.1 |
| 4,582,563 | 4/1986 | Hazuki et al. | 29/591 |
| 4,624,864 | 11/1986 | Hartmann | 437/193 |

FOREIGN PATENT DOCUMENTS

| | | |
|---|---|---|
| 0023146 | 1/1981 | European Pat. Off. |
| 1286737 | 8/1972 | United Kingdom |

OTHER PUBLICATIONS

W. Kern and V. Ban, "CVD of Inorganic Thin Films", *Thin Film Processes*, ed. Vossen, Kern, Academic Press, Inc., Orlando (1978), pp. 315–317.

Smith et al., "Comparison of Two Contact Plug Techniques . . . ", 1986 Proceedings of the IEEE Multilevel Interconnection Conference, Jun. 9–10, 1986, pp. 403–410.

Ghandhi, "VLSI Fabrication Principles", 1983, pp. 458–459, 582–587.

Rothman, "Process for Forming Metal Interconnection System with a Planar Surface," *J. Electrochem. Soc.: Solid-State Sci. & Tech.*, May 1983, pp. 1131–1136.

Levy et al., "Characterization of LPCVD Aluminum for VLSI Processing," *J. Electrochem. Soc.: Solid-State Sci. & Tech.*, Sep. 1984, pp. 2175–2182.

Broadbent et al., "Selective Low Pressure Chemical Vapor Deposition of Tungsten," *J. Electrochem. Soc.: Solid-State Sci. & Tech.*, Jun. 1984, pp. 1427–1433.

Saraswat et al., "Selective CVD of Tungsten for VLSI Technology," *Procs. 2nd Int'l Symp. VLSI Sci. & Tech.*, vol. 84-7, 1984, pp. 409–419.

Smith, "CVD Tungsten Contact Plugs by In Situ Deposition and Etchback, " *Procs. 2nd Int'l IEEE VLSI Multilev. Intercon. Conf.*, Jun. 25–26, 1985, pp. 350–356.

*Primary Examiner*—Brian E. Hearn
*Assistant Examiner*—Laura Holtzman
*Attorney, Agent, or Firm*—T. Briody; A. Tamoshunas; R. Meetin

[57] ABSTRACT

A planar electrical interconnection system suitable for an integrated circuit is created by a process in which an insulating layer (31) having a planar upper surface is formed on a substructure after which openings (32) are etched through the insulating layer. A conductive planarizing layer (33) having a planar upper surface is formed on the insulating layer and in the openings by an operation involving isotropic deposition of a material, preferably tungsten, to create at least a portion of the planarizing layer extending from its upper surface partway into the openings. The planarizing layer is then etched down to the insulating layer. Consequently, its upper surface is coplanar with that of the material (33') in the openings. The foregoing steps are repeated to create another coplanar conductive/insulating layer (34 and 36'). If the lower openings are vias while the upper openings are grooves, the result is a planar interconnect level. Further planar interconnect levels can be formed in the same way.

30 Claims, 5 Drawing Sheets

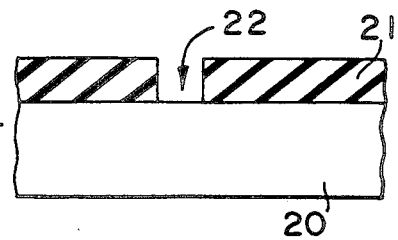
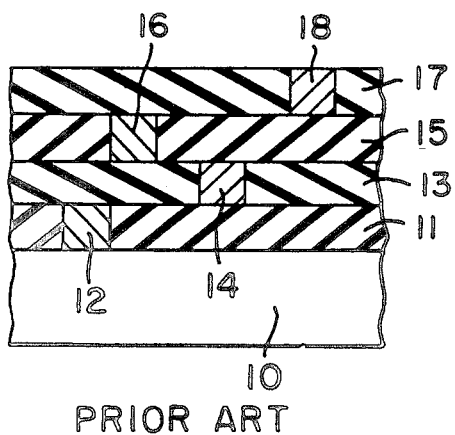
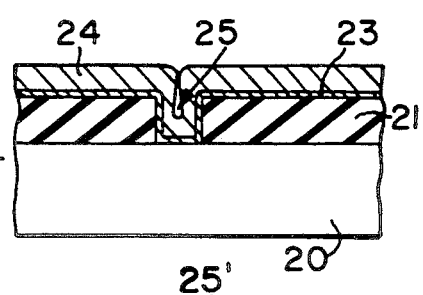
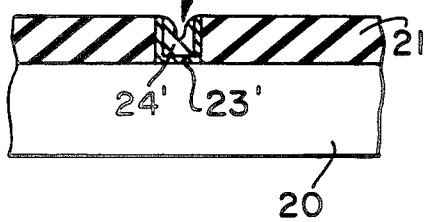
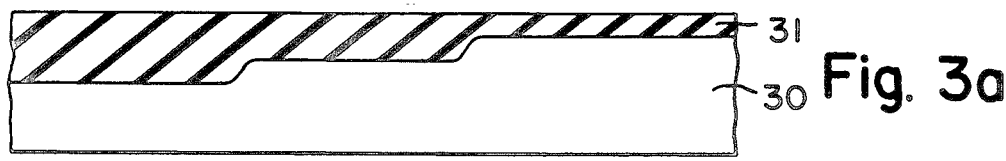
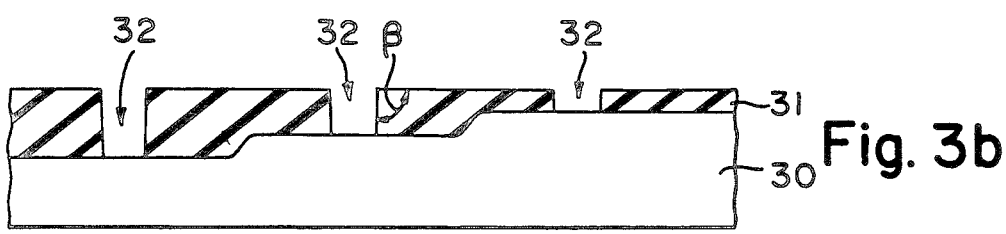
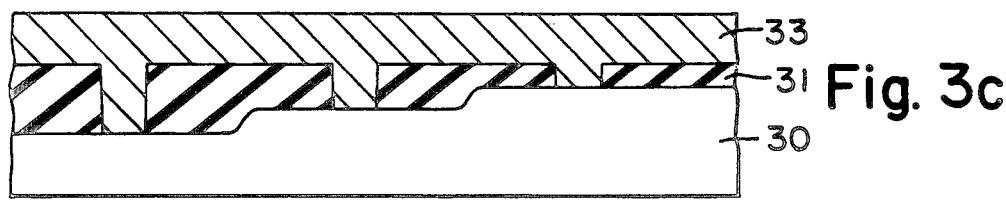
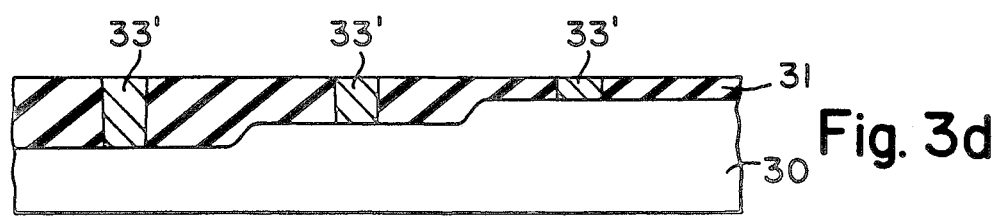

METHOD FOR MANUFACTURING A PLANAR ELECTRICAL INTERCONNECTION UTILIZING ISOTROPIC DEPOSITION OF CONDUCTIVE MATERIAL

This is a continuation of U.S. patent application Ser. No. 224,275, filed July 25, 1988, now abandoned, which is a continuation of U.S. patent application Ser. No. 913,428, filed Sept. 30, 1986, now abandoned.

FIELD OF USE

This invention relates to methods for fabricating electrical interconnections particularly suitable for semiconductor applications.

BACKGROUND ART

The vast majority of electrical interconnection systems employed in semiconductor integrated circuits are non-planar. The degree of non-planarity increases as the number of interconnect levels increases. A disadvantage of non-planar systems is that unwanted open circuits may arise as the result of imperfections in metal step coverage. Similarly, weak areas in insulator step coverage can lead to short circuits between different interconnection levels. Photolithographic and etching difficulties in creating narrow conductive lines on rough surfaces severely restrict the density of electronic elements. A planar interconnect system largely overcomes these problems. A relatively easy method for fabricating a planar system is highly desirable.

U.K. Patent 1,286,737 discloses a technique for manufacturing a planar multi-level interconnection system. With reference to FIG. 1, the starting material in U.K. Patent 1,286,737 is a semiconductor body 10 that adjoins an insulating layer 11 having a planar upper surface. A set of openings are etched through layer 11. A metal layer is deposited on insulator 11 so as to fill the openings. The metal layer is then etched in such a manner that metal fills the openings but does not extend outside them. Item 12 indicates one of the portions of the remaining metal.

Another insulating layer 13 having a planar upper surface is deposited on the coplanar layer formed by insulator 11 and metal portion 12. Openings are selectively etched through layer 13. A metal layer is deposited and etched in the same way as the previous metal layer. The portions of the remaining metal, represented by item 14, are coplanar with insulator 13. These steps are repeated to form a third planar layer consisting of an insulating layer 15 and a metal portion 16 followed by a fourth planar layer consisting of an insulating layer 17 and a metal portion 18.

The metal-filled openings in layers 11, 13, 15, and 17 could be either vias or grooves. Herein, a "via" means a hole (including a contact opening) whose length and width are approximately the same. A "groove" has a much greater length than width. If, for example, each opening in layer 11 is a via while each opening in layer 13 is a groove, metal portions 12 and 14 form a first interconnection level. In like manner, metal portions 16 and 18 form a second interconnect level.

The interconnect system of FIG. 1 is extremely attractive. However, U.K. Patent 1,286,737 does not disclose the particular details of the metal deposition/etching steps that enable each of the composite metal/insulating layers to be planar.

Rothman, "Process For Forming Passivated Metal Interconnection System with a Planar Surface," *J. Electrochem. Soc.: SOLID-STATE SCI. & TECH.*, May 1983, pp. 1131-1136, describes lift-off techniques for depositing an aluminum alloy in cavities in an insulating layer so as to create a composite layer having a planar upper surface. While these lift-off techniques provide relatively good planarity, they involve a large number of complicated and difficult process steps. This limits their usefulness.

Low-pressure chemical vapor deposition (LPCVD) of aluminum is a technique of interest. In Levy et al, "Characterization of LPCVD Aluminum for VLSI Processing," *J. Electrochem. Soc.: SOILD-STATE SCI. & TECH.*, September 1984, pp. 2175-2182, LPCVD aluminum from a tri-isobutyl aluminum source was employed to form an aluminum layer on a dielectric having a rough surface topography. The upper surface of the aluminum layer was largely planar. A disadvantage of this technique is that tri-isobutyl aluminum must be handled very carefully.

Aluminum is the prevalent metal used in interconnects. However, the electromigration resistance of aluminum in pure form or when alloyed with small amounts of copper and/or silicon is relatively low. In addition, aluminum readily interdiffuses with silicon. The resulting degradation of silicon/aluminum junctions leads to undesirably rapid device failure. It does not appear that pure aluminum or conventional aluminum alloys will be capable of meeting the performance requirements for stringent future applications.

A promising interconnect candidate is tungsten whose electromigration resistance is highly superior to that of aluminum. Tungsten has a fairly low resistivity, a high reaction temperature with silicon, a high activation energy, and a high melting temperature. In addition, tungsten acts as a diffusion barrier to silicon and can be readily etched with wet chemicals or plasmas.

A conventional way of depositing tungsten is by LPCVD in which tungsten is supplied by hydrogen reduction of tungsten hexafluoride. The deposition can be highly selective in that tungsten nucleates on certain conductors and semiconductors in preference to insulators. See Broadbent et al, "Selective Low Pressure Chemical Vapor Deposition of Tungsten," *J. Electrochem. Soc.: SOLID-STATE SCI. & TECH.*, June 1984, pp. 1427-1433. Also see Saraswat et al, "Selective CVD of Tungsten for VLSI Technology," *Procs. 2nd Int'l Symp. VLSI Sci. & Tech.*, Vol. 84-7, 1984, pp. 409-419.

Smith, "CVD Tungsten Contact Plugs by In Situ Deposition and Etchback," *Procs. 2nd Int'l IEEE VLSI Multilev. Intercon. Conf.*, 25-26 June 1985, pp. 350-356, describes the use of non-selectively deposited tungsten for via filling. Smith discusses vias (including contact holes) but actually performed his studies on grooves (or trenches). FIGS. 2a-2c show his processing steps. Referring to FIG. 2a, Smith started with a monocrystalline silicon substrate 20 that adjoined a layer 21 of silicon dioxide having a planar upper surface. A groove 22 having nearly vertical sidewalls was etched through layer 21. The aspect ratio—i.e., groove depth divided by groove width—was slightly less than 1

To promote adhesion while avoiding the selective deposition characteristic of tungsten, a thin layer 23 of tungsten silicide was deposited on the structure. A much thicker layer 24 of tungsten with a small percentage of silicon was deposited on layer 23. Both depositions were performed by LPCVD using a vapor consisting of $WF_6$, $H_2$, and $SiH_4$ in which the ratio of tungsten to silicon in each of layers 23 and 24 was controlled by adjusting the $WF_6$ flow rate. The upper surface of layer 24 was nearly planar as indicated in FIG. 2b. However, a void 25 occurred in layer 24 at the location of groove 22. I believe that void 25 was produced because the silane ($SiH_4$) caused the hydrogen to reduce the tungsten hexafluoride in the vapor area away from the deposition surfaces. The tungsten thereby accumulated at a lower rate in the more highly shadowed areas in groove 22.

A plasma etch was performed to remove the material of layers 23 and 24 down to the upper surface of insulator 21 as indicated in FIG. 2c. Items 23′ and 24′ respectively indicate the remaining portions of layers 23 and 24. Void 25 opened into a slot 25′ at the top of W portion 24′. Due to the difficulties that would be encountered in providing step coverage on slot 25′, its presence is undesirable.

GENERAL DISCLOSURE OF THE INVENTION

The present invention is a straightforward method for fabricating a highly planar electrical interconnection structure using isotropic deposition of a conductive material such as tungsten in filling openings in insulating material. "Isotropic deposition" means that the deposited material accumulates at substantially the same rate on the deposition surfaces regardless of their orientations and locations. The interconnect openings in the present structure typically have nearly vertical sidewalls and may be quite narrow—e.g., 1 micron or less in width or diameter. Due to the isotropic nature of the deposition, the conductive material in the openings is normally void-free. This is true even if the aspect ratio is considerably greater than 1—e.g., as much as 3. Because the interconnect structure is planar, it is especially suitable for high-density semiconductor applications.

The starting point for the invention is a substructure which could, for example, be a semiconductor body having various doped regions. An insulating layer having a largely planar upper surface is formed on the substructure. A set of openings are etched through the insulating layer down to the substructure.

In accordance with the invention, a conductive planarizing layer having a largely planar upper surface is formed on the insulating layer by an operation in which a specified material is isotropically deposited to create at least a portion of the planarizing layer extending from its upper surface partway into the openings. A relatively uniform thickness of the planarizing layer is removed down to the insulating layer. As a result, the upper surface of the insulating layer is coplanar with the upper surfaces of the conductive material in the openings.

A second insulating layer having a largely planar upper surface is now formed on the first-mentioned insulating layer and on the material occupying the openings. A second set of openings are etched through the second insulating layer down to material in the first-mentioned set of openings. A second conductive planarizing layer having a largely planar upper surface is formed on the second insulating layer and in the second openings by an operation in which a specified material is isotropically deposited to create at least a portion of the second planarizing layer extending from its upper surface partway into the second openings. Selected material of the second planarizing layer is then removed so as to leave the remainder in a desired conductive pattern. This preferably involves removing a relatively uniform thickness of the second planarizing layer down to the second insulating layer. Accordingly, the second insulating layer and the material in the second openings are coplanar.

Each opening in the first insulating layer is typically a via, while each opening in the second insulating layer is a groove. The conductive material occupying both sets of openings (in conjunction with the two insulating layers themselves) thereby forms a planar interconnection level. Further planar interconnect levels can be formed above the first one in the same manner.

The specified materials are normally the same material. In forming the planarizing layers, a thin conductive lower layer that acts as a uniform nucleation surface for this material is typically deposited on each insulating layer so as to avoid any selectivity that the specified material may have for depositing on conductive/semiconductive material in preference to insulating material (or vice versa). The thickness of the lower layer is much less than the minimum lateral dimension of the openings.

The specified material is then isotropically deposited on the lower layer to form a much thicker upper layer. This operation is performed by chemical vapor deposition in which the specified material is provided from a gaseous species by a surface-controlled reaction in the immediate vicinity of where the specified material accumulates to form the upper layer. Because the chemical reaction to free the specified material from the gaseous species occurs at or very close to the deposition surfaces, the material deposits in a uniform manner to fill the openings. The result is that, after deposition of a sufficient amount of the specified material, the upper surface of the upper layer becomes largely planar.

The specified material is preferably tungsten supplied from tungsten hexafluoride by hydrogen reduction. The vapor carrying the tungsten hexafluoride is silane-free. This appears to account for the isotropic nature of the deposition. The use of tungsten in the present manner leads to a great advance over the prior art.

BRIEF DESCRIPTION OF THE DRAWINGS

FIG. 1 is a cross-sectional structural view of a prior art interconnect system.

FIGS. 2a, 2b, and 2c are cross-sectional structural views representing steps in a known process for depositing tungsten in a via.

FIGS. 3a, 3b, 3c, 3d, 3e, 3f, 3g, 3h, 3i, 3j, 3k, 3l, 3m, and 3n are cross-sectional structural views representing steps in manufacturing an interconnect system according to the invention.

To simplify illustration of the invention, FIGS. 4 and 6 employ the shading of the cross-sectional views even though FIG. 4 and 6 are not cross-sectional views.

Like reference symbols are employed in the drawings and in the description of the preferred embodiments to represent the same or very similar item or items.

DESCRIPTION OF THE PREFERRED EMBODIMENTS

Figure 3E:
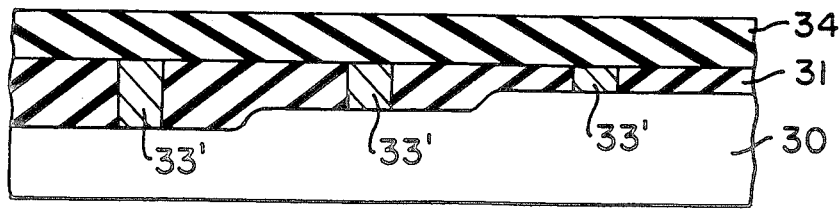
Figure 3F:
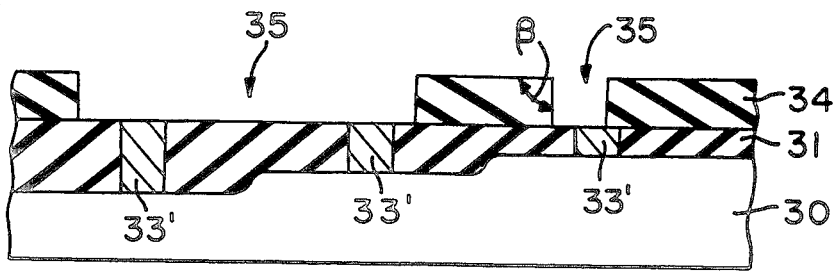
Figure 3G:
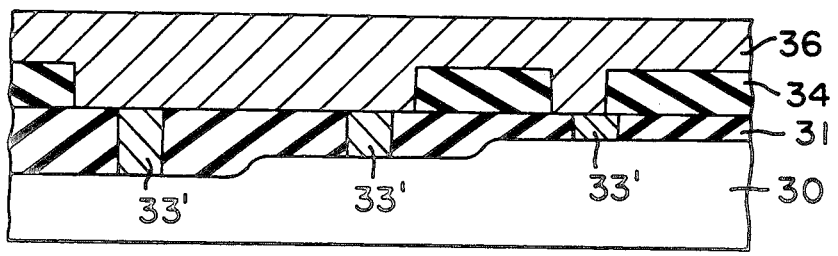
Figure 3H:
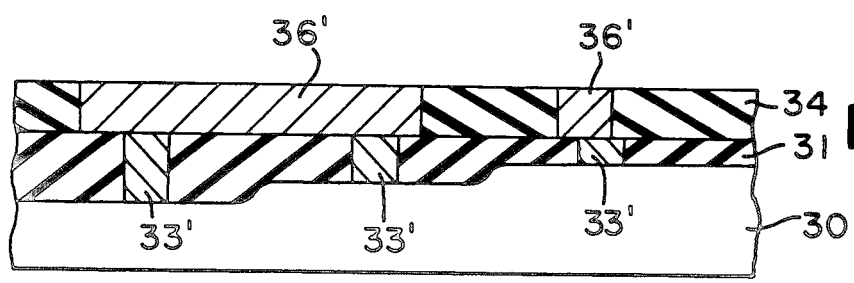
Figure 3I:
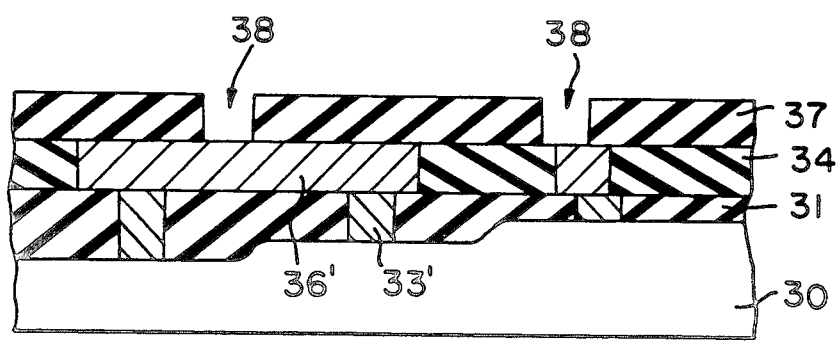
Figure 3J:
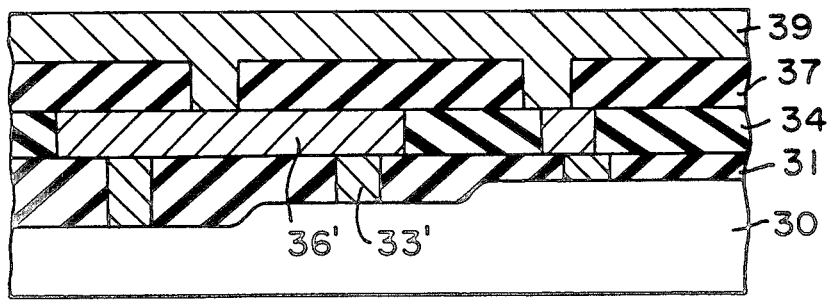
Figure 3K:
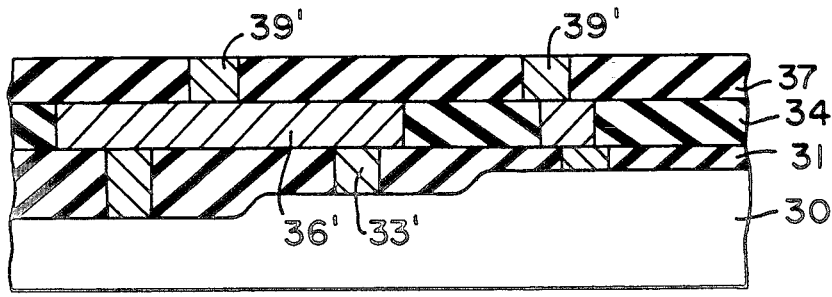
Figure 3L:
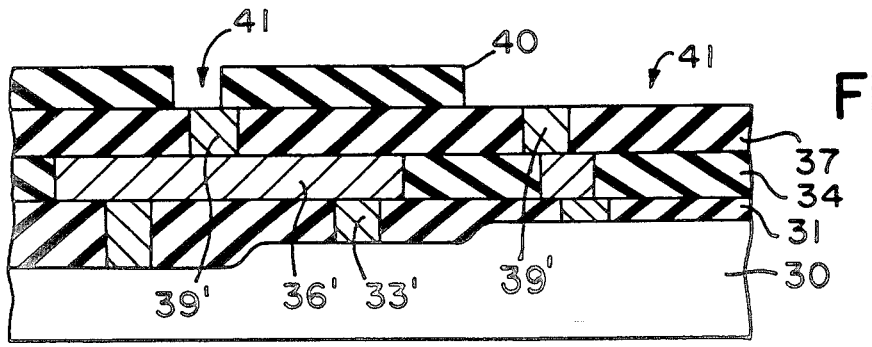
Figure 3M:
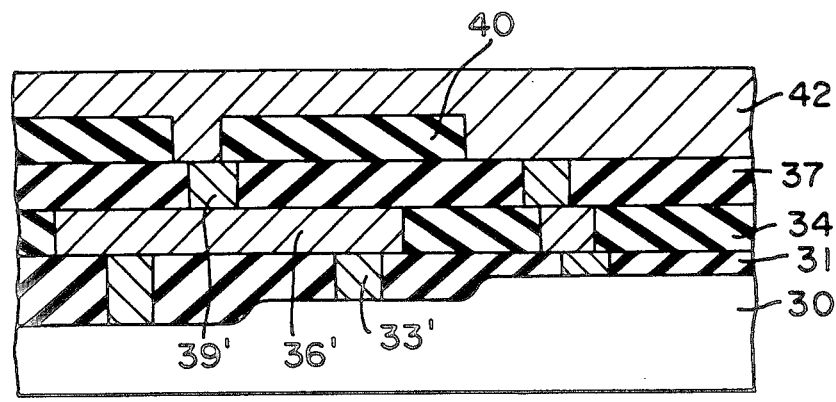
Figure 3N:
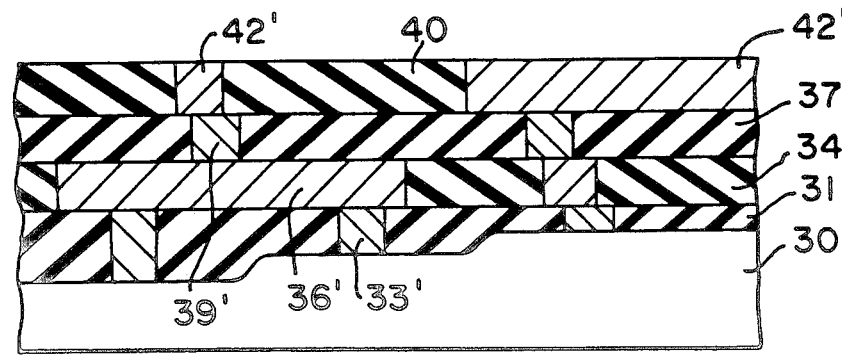

FIGS. 3a–3n illustrate steps for fabricating a two-level largely planar electrical interconnection system for a semiconductor device. By way of explanation without limiting the invention, a surface having a roughness of no more than 0.2 micron would generally be "largely planar". In the following manufacturing discussion, reference to a surface (or other item) as being "planar" means "largely planar".

Photoresist masks (not shown in the drawings) are formed according to conventional photolithographic techniques. Openings, whether vias or grooves, through a layer of silicon dioxide are created by forming a suitably patterned photoresist mask on the oxide layer and then etching with a plasma based on a fluorine-containing gas such as a freon. Cleaning steps and other such standard operations are not described below to shorten the description.

The aspect ratio for an opening through a layer of material is the depth of the opening divided by the minimum lateral dimension of the opening at one half its depth. The "at-one-half-its-depth" limitation drops out if the opening has nearly vertical sidewalls. For a vertically sidewalled groove, the aspect ratio is groove depth divided by width since the width is the minimum lateral dimension. Similarly, the aspect ratio for a vertically sidewalled circular via is via depth divided by diameter inasmuch as the via width is the diameter for a circular via.

The starting material is a wafer formed with a body 30 consisting of a P-type or N-type monocrystalline silicon semiconductor substrate or of such a substrate with an epitaxial layer grown on it. Various N-type and P-type regions exist in the monocrystalline silicon. Body 30 may also have an interconnection layer of doped polycrystalline silicon that selectively contacts the substrate or epitaxial layer through vias in a layer of silicon dioxide. The details of body 30 are not shown in the drawings. However, its upper surface is typically non-planar as, for example, indicated by the steps shown at the top of body 30 in FIG. 3a.

A first insulating layer 31 of silicon dioxide having a planar upper surface is formed along the upper surface of body 30. This is typically done by depositing silicon dioxide on body 30, forming a layer of exposed photoresist on the oxide, flowing the photoresist so that its upper surface becomes planar, and then removing the photoresist layer with a plasma that etches the photoresist and silicon dioxide at approximately the same rate. The etch removes the steps along the top of the deposited oxide, thereby producing layer 31.

Figure 4:
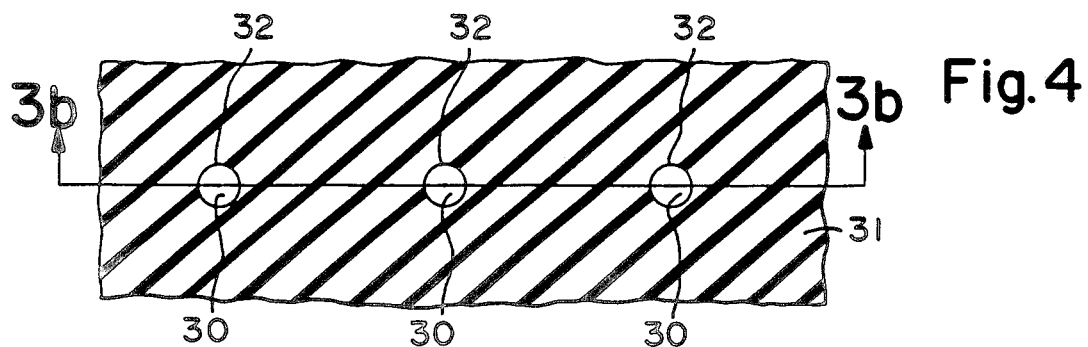
FIG. 4 is a top view of the structure of FIG. 3b which goes through plane 3b-3b.

A set of generally circular vias 32 having a diameter of about 1 micron are etched through layer 31 down to body 30 as shown in FIG. 3b. Due to the steps along the top of body 30, vias 32 extend to different depths. The via depth, for example, varies from 0.4 to 2 microns. The sidewalls of vias 32 are nearly vertical. In particular, the angle $\beta$ between the sidewalls of each via 32 and the upper surface of layer 31 is slightly more than 90°, typically about 95°. Consequently, the via aspect ratio varies from about 0.4 to 2. FIG. 4 shows a top view of FIG. 3b.

A first electrically conductive planarizing layer 33 is formed on oxide layer 31 in such a manner that layer 33 has a planar upper surface. See FIG. 3c. Layer 33 is created by an operation involving isotropic LPCVD of tungsten by hydrogen reduction of tungsten hexafluoride. FIGS. 5a–5e illustrate a preferred way for performing this operation.

As indicated above, LPCVD tungsten supplied from $WF_6$ nucleates (or accumulates) on silicon and metals in preference to silicon dioxide. The selective deposition property must be avoided before tungsten LPCVD can be isotropic. This is accomplished by first depositing a thin electrically conductive sticking layer which acts as a uniform nucleation source for tungsten while simultaneously adhering to the oxide in layer 31 and to the silicon at the bottoms of vias 32. The thickness of the sticking layer is much less than the diameter of vias 32. Depending on $\beta$, the ratio of via diameter to sticking layer thickness is normally at least 5 and is typically in the vicinity of 25.

Figure 5A:
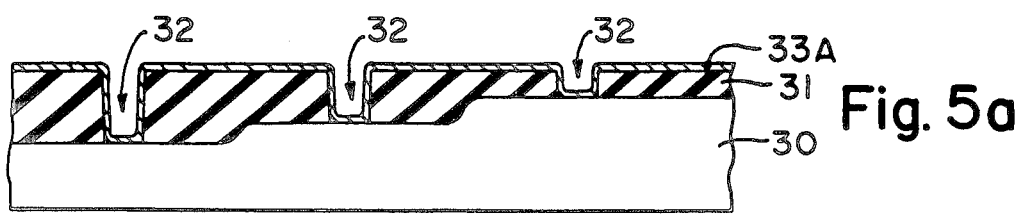
FIGS. 5a, 5b, 5c, 5d, 5e are cross-sectional structural views representing preferred steps leading from the structure of FIG. 3b to the structure of FIG. 3c.

The sticking layer preferably consists of a pair of sublayers 33A and 33B. Referring to FIG. 5a, 200 angstroms of titanium is deposited on layer 31 and into vias 32 according to conventional sputtering techniques at room temperature in an atmosphere of 0.003 torr of argon to form layer 33A. Titanium adheres well to silicon and to silicon dioxide. Because sputtering is a non-isotropic physical deposition process, the thickness of titanium layer 33A varies somewhat from point to point. Layer 33A is normally thinner in shadowed areas. This is not particularly critical as long as layer 33A has no serious discontinuities.

Figure 5B:
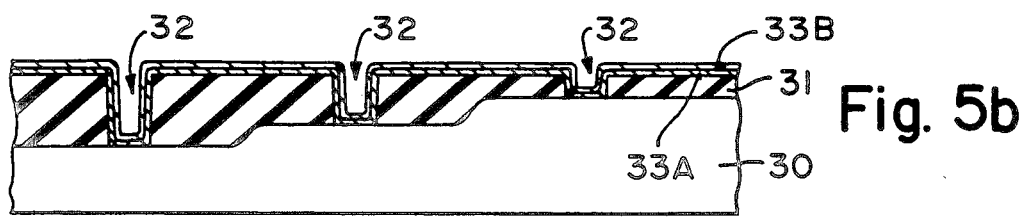

Titanium is not a good nucleation surface for LPCVD tungsten because the flourine in $WF_6$ reacts with the titanium to form highly resistive $TiF_3$. Accordingly, about 200 angstroms of tungsten is sputter deposited on layer 33A under the above-mentioned conditions to form layer 33B as indicated in FIG. 5b. The tungsten in layer 33B adheres well to titanium and, of course, serves as an excellent nucleation surface for LPCVD tungsten. As with layer 33A, certain parts of W layer 33B are thinner than others. This is likewise not particularly critical as long as layer 33B is continuous.

A layer 33C of tungsten is now formed on layer 33B by reducing $WF_6$ in a low-pressure $H_2$ environment. The LPCVD operation is initiated by placing the wafer containing the structure of FIG. 5b into a suitable deposition reactor, reducing the reactor pressure to a low value, and heating the wafer to a temperature in the range of 300° C. to 500° C. The wafer (or deposition) temperature is preferably 425° C. The reactor is purged with $H_2$ or an inert gas during the temperature rise. When the desired temperature is reached, the purge is terminated and the reactor is adjusted to a pressure normally less than 0.05 torr.

Metered quantities of $WF_6$ and $H_2$ are introduced into the reactor. ($SiH_4$ is specifically avoided.) The $WF_6$ flow rate should be no more than 1,000 standard $cm^3$/minute (SCCM) and is preferably 200 SCCM. The $H_2$ flow rate should be no more than 8,000 SCCM and is preferably 1,500 SCCM. The reactor pressure during W deposition is controlled so as to be 1 torr or less at which consistent molecular flow occurs. The deposition pressure is preferably 0.5–0.6 torr.

The tungsten deposition proceeds according to the reaction:

$$WF_6 + 3H_2 \rightarrow W + 6HF$$

The reaction is surface controlled under the foregoing deposition conditions. That is, tungsten is freed from WF$_6$ at or very close to the surfaces where tungsten accumulates to form layer 33A. It appears that very little, if any, tungsten hexafluoride is reduced in the WF$_6$/H$_2$ vapor at points distant from the deposition surfaces. The WF$_6$/H$_2$ vapor is distributed uniformly along the wafer surface. Also, the temperature is largely the same across the wafer. Consequently, tungsten accumulates on the deposition surfaces at largely the same rate irrespective of their orientations. The deposition is isotropic.

At the preferred flow rates, temperature, and pressure, tungsten deposits at a rate of 500–600 angstroms/minute. The deposition time is preferably 30 minutes. This produces an "equivalent" W thickness of about 1.5 microns.

Figure 5C:
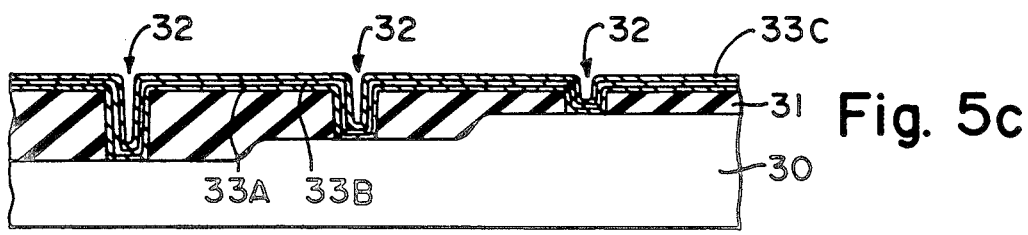
Figure 5D:
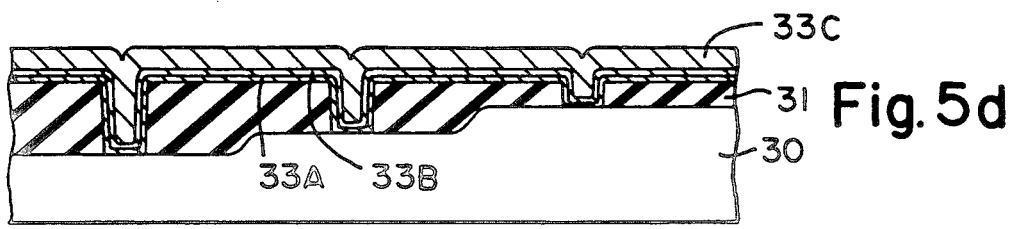
Figure 5E:
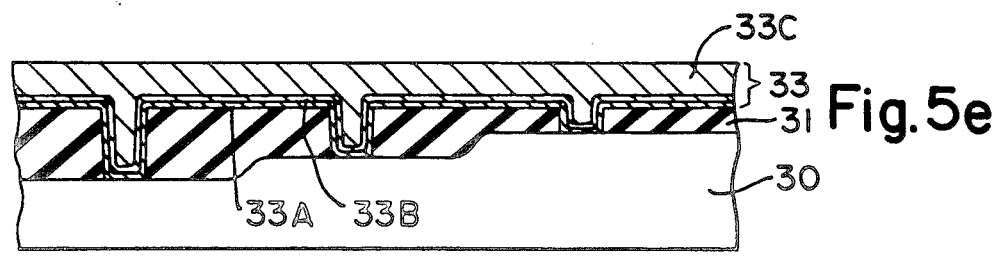

FIGS. 5c–5e illustrate how layer 33C builds up. Because the deposition is isotropic and because sidewall angle $\beta$ is slightly greater than 90°, the sidewalls of each low area at vias 32 close in on each other in a uniform manner from the bottom up. The sidewalls of each low area would just meet if the equivalent W thickness equaled a "touching" value slightly less than one half the via diameter (of 1.0 micron). In the present case, the equivalent W thickness is about three times the touching value. Accordingly, the sidewalls of each low area close completely in a void-free manner so that layer 33C has a planar upper surface as indicated in FIG. 5e. Layers 33A, 33B, and 33C of FIG. 5e form planarizing layer 33 of FIG. 3c.

After removing the structure from the deposition reactor, the structure is etched with suitable plasmas to remove a relatively uniform thickness of layer 33 down to the upper surface of oxide 31. This includes removal of the portion of layer 33A lying on the upper surface of layer 31. A fluorine-containing plasma is used to etch the excess tungsten. The excess titanium is removed with a chlorine-based plasma. Both plasmas may use oxygen. The etching may go a few hundred angstroms below the upper surface of layer 31 without significantly affecting the planarity of the structure from a practical sense. The upper surfaces of the remaining portions 33' of layer 33 are coplanar with the upper surface of layer 31 as shown in FIG. 3d.

In some cases, the upper surface of layer 33 in FIG. 3c may have a non-negligible amount of roughness due to the crystallization properties of the tungsten grains. Portions 33' would normally reflect this roughness. It can be sharply reduced by initially providing layer 33 with a thin photoresist layer whose upper surface is more planar than that of layer 33. The photoresist layer and the upward-protruding parts of layer 33 are removed by etching with an etchant that attacks tungsten and the photoresist at close to the same rate. If this etchant is the above-mentioned fluorine-based plasma, layers 33B and 33C and the photoresist layer can be etched in a single step. Layer 33A is then etched as described above to achieve the structure of FIG. 3d.

Silicon dioxide is deposited on layer 31 and on metal portions 33' according to conventional techniques to form a second insulating layer 34 having a planar upper surface. See FIG. 3e. Oxide 34 has a thickness of 1.5–2.0 micron.

Figure 6:
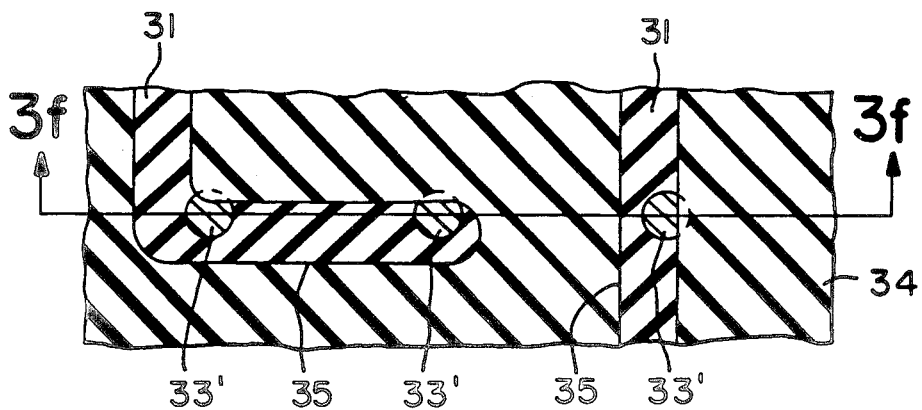
FIG. 6 is a top view of the structure of FIG. 3f which goes through plane 3f-3f.

A pattern of grooves 35 corresponding to the desired conductor pattern for the first interconnect level are etched through layer 34 down to portions 33' as depicted in FIG. 3f. The sidewalls of grooves 35 are nearly vertical, sidewall angle $\beta$ again being about 95°. The groove width is 1–1.5 microns. Since the depth of grooves 35 is 1.5–2.0 microns, the groove aspect ratio varies from about 1.0 to 0.5. In FIG. 3f, the lefthand groove 35 is shown along its length, while the righthand groove 35 is shown along its width. FIG. 6 shows a top view of FIG. 3f.

A second electrically conductive planarizing layer 36 is formed on layer 34 as depicted in FIG. 3g. Layer 36 is preferably created in precisely the same way as layer 33. In particular, a lower layer consisting of 200 angstroms of sputtered titanium followed by 200 angstroms of sputtered tungsten is deposited on layer 34 and in grooves 35. An upper layer is formed by isotropically depositing an equivalent thickness of about 1.5 microns of tungsten on the lower layer. As the tungsten deposits, the sidewalls of each low area at grooves 35 close in a uniform manner from the bottom up. Because the equivalent W thickness is at least twice the touching value, the sidewalls of the lower areas close in a void-free manner to produce a planar upper surface for layer 36.

Using the plasmas employed to etch layer 33, a relatively uniform thickness of layer 36 is removed down to the upper surface of layer 34. Again, the etching may go slightly below the upper surface of layer 34 without causing significant damage to the planarity of the structure. The combination of metal portions 33' and 36' in conjunction with oxide layers 31 and 34 forms a planar interconnect level.

The foregoing steps are now repeated to produce another planar interconnect level as shown in FIGS. 3i–3n. Only a brief discussion of these steps is given here.

A third electrically insulating layer 37 is deposited to a thickness of 0.7–1.5 microns and then selectively etched to form vias 38 having a diameter of about 1 micron. A third electrically conductive planarizing layer 39 having a planar upper surface is formed in the manner described above for layer 33. A relatively uniform thickness of layer 39 is removed down to the upper surface of layer 37 to produce the structure shown in FIG. 3k.

A fourth electrically insulating layer 40 is deposited and then selectively etched to form a pattern of grooves 41 corresponding to the desired conductor pattern for the second interconnect level. Grooves 41 have the same depth and width as grooves 35. A fourth electrically conductive planarizing layer 42 is created in the same way as layer 36 so as to have a planar upper surface. A relatively uniform thickness of layer 42 is etched away down to the upper surface of layer 40. In combination with insulating layers 37 and 40, the remaining metal portions 39' and 42' of respective layers 39 and 42 form the second interconnect level as shown in FIG. 3n.

The process of FIGS. 3a–3n thus yields a planar two-level void-free interconnect system. Further planar levels can be added in the same manner.

In some applications, planarizing the upper interconnect level will not lead to a significant increase in device density. A non-planar upper interconnect level may be acceptable if the number of process steps can be reduced.

Figure 7:
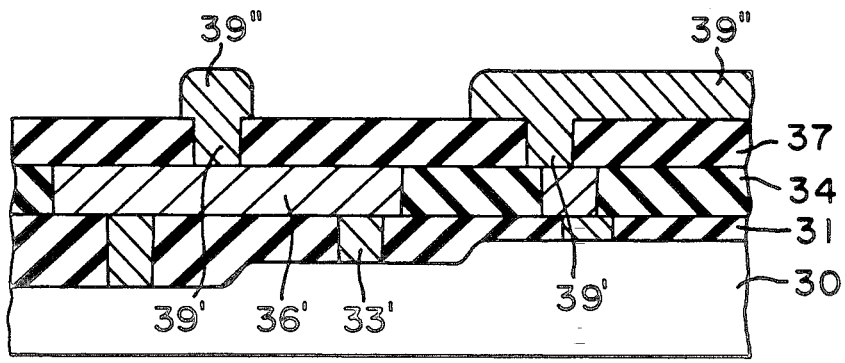
FIG. 7 is a cross-sectional structural view for an alternative method of finishing the structure of FIG. 3j.

For example, the structure of FIG. 3j can alternatively be processed in the manner indicated in FIG. 7. Using an appropriate photoresist mask, layer 39 is selectively etched to define the desired pattern for the second interconnect level. The etching may be done with wet chemicals or with the plasmas used to etch layer 33. The remaining conductive portions 39" of the upper part of layer 39 entirely overlie conductive portions 39' in vias 38.

Figure 8A:
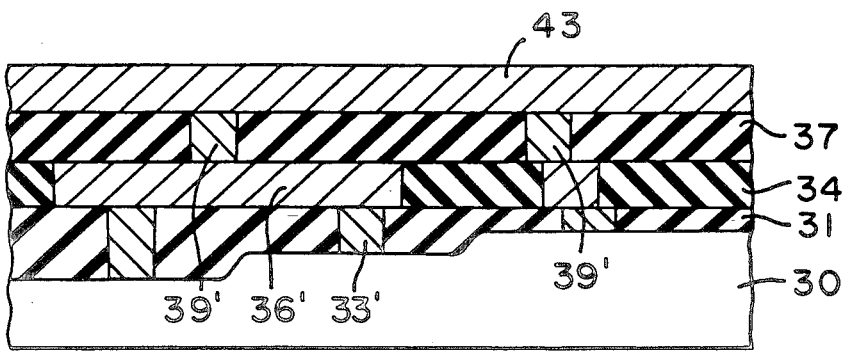
FIGS. 8a and 8b are cross-sectional structural views representing an alternative set of steps for completing the structure of FIG. 3k.
Figure 8B:
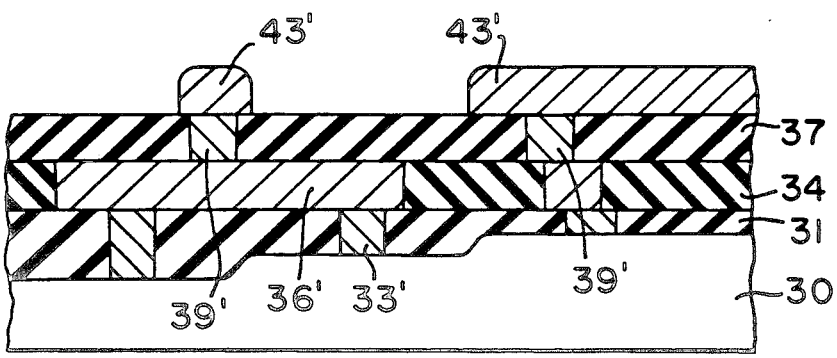

As another example, the steps shown in FIGS. 8a and 8b can be used to finish the structure of FIG. 3k. A blanket layer 43 of an electrical conductor such as aluminum is deposited on layer 37 and metal portions 39'. See FIG. 8a. The undesired portions of layer 43 are etched away using an appropriate photoresist mask. The remaining conductive portions 43' of layer 43 constitute the upper half of the second interconnect levels as shown in FIG. 8b.

The excellent electromigration resistance of tungsten makes it particularly attractive for use in the invention. Much work has also been done in characterizing tungsten for semiconductor applications. Other conductive materials could, however, be used in the invention if they can be deposited isotropically. One candidate is molybdenum. As a "sister" element to tungsten, molybdenum has similar properties. It is available in gaseous $MoF_6$.

While the invention has been described with reference to particular embodiments, this description is solely for the purpose of illustration and is not to be construed as limiting the scope of the invention claimed below. For example, an experimental structure containing void-free metal-filled grooves of 0.75-micron width with an aspect ratio of about 3 has been built. The lowest composite conductive/insulating layer formed according to the invention might contain grooves rather than vias.

The work of Levy et al seems to indicate that there are conditions under which aluminum can be isotropically deposited to achieve a planar surface. It may thus be possible to use aluminum for isotropically filling the openings in the insulating layers. A nucleating layer might be needed to avoid selective aluminum LPCVD. Accordingly, various modifications, changes, and applications may be made by those skilled in the art without departing from the true scope and spirit of the invention as defined by the appended claims.

I claim:

1. A method wherein a first electrically insulating layer having a largely planar upper surface is formed on a substructure, and first openings are etched through the first insulating layer down to the substructure, characterized by the steps of:

forming a first electrically conductive planarizing layer having a largely planar upper surface on the first insulating layer and in the first openings by an operation in which tungsten or molybdenum is isotropically deposited to create at least a portion of the first planarizing layer extending from its upper surface partway into the first openings;

removing a relatively uniform thickness of the first planarizing layer down to the upper surface of the first insulating layer;

forming a second electrically insulating layer having a largely planar upper surface on the first insulating layer and on the material in the first openings;

etching second openings through the second insulating layer down to the material in the first openings;

forming a second electrically conductive planarizing layer having a largely planar upper surface on the second insulating layer and in the second openings by an operation in which tungsten or molybdenum is isotropically deposited to create at least a portion of the second planarizing layer extending from its upper surface partway into the second openings; and removing selected material of the second planarizing layer so as to leave the remainder of the second planarizing layer in a desired pattern; where each isotropic deposition entails providing tungsten or molybdenum from a species in a vapor by a surface-controlled chemical reaction in the immediate vicinity of where the tungsten or molybdenum accumulates.

2. A method as in claim 1 characterized in that the step of removing selected material entails removing a relatively uniform thickness of the second planarizing layer down to the upper surface of the second insulating layer.

3. A method as in claim 2 characterized in that each first opening is one of a via and a groove, and each second opening is the other of a via and a groove, where each via has approximately equal length and width, and each groove has much greater length than width.

4. A method as in claim 3 characterized in that: each opening has nearly vertical sidewalls; and at least one of the openings has an aspect ratio of 2 or more and a minimum lateral dimension of 1 micron or less.

5. A method as in claim 4 characterized in that material of the first and second planarizing layers respectively fills the first and second openings in a substantially void-free manner.

6. A method as in claim 1, 3, or 5 characterized in that the species in each isotropic deposition is tungsten hexafluoride, the vapor being substantially silane free.

7. A method in which an electrically insulating layer having a largely planar upper surface is formed on a substructure, and first openings are etched through the first insulating layer down to the substructure, characterized by the steps of:

forming a first planarizing layer by (1) creating a first lower layer on the first insulating layer and in the first openings, the first lower layer comprising electrically conductive material that adheres to the first insulating layer, adheres to the material exposed through the first openings, and acts as a nucleation surface for tungsten, and (2) isotropically depositing a sufficient amount of tungsten on the first lower layer to form a much thicker first upper layer having a largely planar upper surface;

removing a relatively uniform thickness of the first planarizing layer down to the upper surface of the first insulating layer;

forming a second electrically insulating layer having a largely planar upper surface on the first insulating layer and on the material in the first openings;

etching second openings through the second insulating layer down to the material in the first openings;

forming a second planarizing layer by (1) creating a second lower layer on the second insulating layer and in the second openings, the second lower layer comprising electrically conductive material that adheres to the second insulating layer, adheres to the material exposed through the second openings, and acts as a nucleation surface for tungsten, and (2) isotropically depositing a sufficient amount of tungsten on the second lower layer to form a much thicker second upper layer having a largely planar upper surface; and removing a relatively uniform thickness of the second planarizing layer down to the upper surface of the second insulating layer.

8. A method as in claim 7 characterized by the steps of:
forming a third electrically insulating layer having a largely planar upper surface on the second insulating layer and on the material in the second openings;
etching third openings through the third insulating layer down to the material in the second openings;
forming a third planarizing layer by (1) creating a third lower layer on the third insulating layer and in the third openings, the third lower layer comprising electrically conductive material that adheres to the third insulating layer, adheres to the material exposed through the third openings, and acts as a nucleation surface for tungsten, and (2) isotropically depositing a sufficient amount of tungsten on the third lower layer to form a much thicker third upper layer having a largely planar upper surface; and
removing a relatively uniform thickness of the third planarizing layer down to the upper surface of the third insulating layer.

9. A method as in claim 8 characterized by the steps of:
forming a fourth electrically insulating layer having a largely planar upper surface on the third insulating layer and on the material in the third openings;
etching fourth openings through the fourth insulating layer down to the material in the third openings;
forming a fourth planarizing layer by (1) creating a fourth lower layer on the fourth insulating layer and in the fourth openings, the fourth lower layer comprising electrically conductive material that adheres to the fourth insulating layer, adheres to the material exposed through the fourth openings, and acts as a nucleation surface for tungsten, and (2) isotropically depositing a sufficient amount of tungsten on the fourth lower layer to form a much thicker fourth upper layer having a largely planar upper surface; and
removing a relatively uniform thickness of the fourth planarizing layer down to the upper surface of the fourth insulating layer.

10. A method as in claim 9 characterized in that: each of the first and third openings is a via whose length and width are approximately the same; and each of the second and fourth openings is a groove having much greater length than width.

11. A method as in claim 7 characterized by the steps of:
forming a third eletrically insulating layer having a largely planar upper surface on the second insulating layer and on the material in the second openings;
etching third openings through the third insulating layer down to the material in the second openings;
forming a third planarizing layer by (1) creating a third lower layer on the third insulating layer and in the third openings, the third lower layer comprising electrically conductive material that adheres to the third insulating layer, adheres to the material exposed through the third openings, and acts as a nucleation surface for tungsten, and (2) isotropically depositing a sufficient amount of tungsten on the third lower layer to form a much thicker third upper layer having a largely planar upper surface; and
selectively removing portions of the third planarizing layer down to the upper surface of the third insulating layer.

12. A method as in claim 8 characterized by the steps of:
depositing an electrically conductive blanket layer on the third insulating layer and on the material in the third openings; and
selectively removing portions of the blanket layer down to the upper surface of the third insulating layer.

13. A method as in claim 11 or 12 characterized in that: each first opening is a via whose length and width are approximately the same; and each second opening is a groove having much greater length than width.

14. A method as in claim 7 characterized in that: each opening has nearly vertical sidewalls; and at least one of the openings has an aspect ratio of 2 or more.

15. A method as in claim 7 characterized in that: the average angle between the upper surface of each insulating layer and the sidewalls of each opening through that insulating layer is no less than 90°; at least one of the openings has an aspect ratio greater than 1; and each planarizing layer is substantially void-free.

16. A method as in claim 7, 9, 11, or 12 characterized in that each isotropic deposition entails providing tungsten from a species in a vapor by a surface-controlled chemical reaction in the immediate vicinity of where the tungsten deposits.

17. A method as in claim 16 characterized in that the species is tungsten hexafluoride, the vapor being substantially silane free.

18. A method as in claim 7 characterized in that the creation of each lower layer entails:
forming a first sublayer that adheres to the underlying insulating layer and to the material exposed through its openings; and
subsequently forming a second sublayer that adheres to the first sublayer and acts as a nucleation surface for tungsten.

19. A method as in claim 18 characterized in that: the steps of forming the first and second sublayers respectively comprise physically depositing titanium and tungsten; and the vapor in each isotropic deposition includes tungsten hexafluoride as the species, the vapor being substantially silane free.

20. A method as in claim 7 characterized in that each step of removing comprises etching the associated planarizing layer starting with its upper surface substantially fully exposed.

21. A method as in claim 7 characterized in that each step of removing comprises:
forming on the associated planarizing layer a further layer whose upper surface is more planar than the upper surface of that planarizing layer;
removing the further layer and upward-protruding parts of that planarizing layer with etchant that attacks material of the further layer and that planarizing layer at rates not substantially different from each other; and
removing further material of that planarizing layer down to the upper surface of the underlying insulating layer.

22. A method in which an electrically insulating layer having a largely planar upper surface is formed on a substructure, and first openings are etched through the first insulating layer down to the substructure, each first opening being a via whose length and width are approximately the same, characterized by the steps of:

forming a substantially void-free first planarizing layer by (1) creating a first lower layer on the first insulating layer and in the first openings, the first lower layer consisting substantially of electrically conductive material that adheres to the first insulating layer, adheres to the material exposed through the first openings, and acts as a tungsten nucleation surface, and (2) isotropically depositing tungsten on the first lower layer to form a much thicker first upper layer having a largely planar upper surface;

removing a relatively uniform thickness of the first planarizing layer down to the upper surface of the first insulating layer;

forming a second electrically insulating layer having a largely planar upper surface on the first insulating layer and on the material in the first openings;

etching second openings through the second insulating layer down to the material in the first openings, each second opening being a groove having much greater length than width;

forming a substantially void-free second planarizing layer by (1) creating a second lower layer on the second insulating layer and in the second openings, the second lower layer consisting substantially of electrically conductive material that adheres to the second insulating layer, adheres to the material exposed through the second openings, and acts as a tungsten nucleation surface, and (2) isotropically depositing tungsten on the second lower layer to form a much thicker second upper layer having a largely planar upper surface; and removing a relatively uniform thickness of the second planarizing layer down to the upper surface of the second insulating layer; where each isotropic deposition entails providing tungsten from a species in a vapor by a surface-controlled chemical reaction in the immediate vicinity of where the tungsten accumulates.

23. A method as in claim 22 characterized in that: each opening has nearly vertical sidewalls; and at least one of the openings has an aspect ratio of 2 or more and a minimum lateral dimension of 1 micron or less.

24. A method as in claim 22 or 23 characterized in that the vapor in each isotropic deposition includes tungsten hexafluoride as the species, the vapor being substantially silane free.

25. A method wherein an electrically insulating layer having a largely planar upper surface is formed on a substructure, and openings are etched through the insulating layer down to the substructure, characterized by the steps of:

forming a continuous electrically conductive layer by (1) creating a lower layer over the insulating layer and in the openings, the lower layer consisting substantially of electrically conductive material that adheres to the insulating layer, adheres to the material exposed through the openings, and acts as a tungsten nucleation surface, and (2) creating a much thicker upper layer of tungsten over the lower layer by an operation in which tungsten is isotropically deposited from a species in a vapor by a surface-controlled chemical reaction in the immediate vicinity of where the tungsten accumulates, material of the continuous layer filling the openings in a substantially void-free manner; and removing material of the continuous layer down to the upper surface of the insulating layer.

26. A method as in claim 25 characterized in that: each opening has nearly vertical sidewalls; and at least one of the openings has an aspect ratio of 2 or more and a minimum lateral dimension of 1 micron or less.

27. A method as in claim 26 characterized in that the vapor comprises (1) tungsten hexafluoride as the species and (2) hydrogen for reducing the tungsten hexafluoride, the vapor being substantially silane free.

28. A method as in claim 25 characterized in that the creation of the lower layer entails:

forming a first sublayer that adheres to the insulating layer and to the material exposed through the openings; and subsequently forming a second sublayer that adheres to the first sublayer and acts as a tungsten nucleation surface.

29. A method as in claim 28 characterized in that: the steps of depositing the first and second sublayers respectively comprise physically depositing titanium and tungsten; the species is tungsten hexafluoride; and the vapor is substantially silane free.

30. A method as in claim 25 characterized in that the continuous layer has a largely planar upper surface.

* * * * *